US012575123B2

(12) United States Patent
Yen et al.

(10) Patent No.: US 12,575,123 B2
(45) Date of Patent: Mar. 10, 2026

(54) SEMICONDUCTOR DEVICE AND MANUFACTURING METHOD THEREOF

(71) Applicant: Taiwan Semiconductor Manufacturing Company, Ltd., Hsinchu (TW)

(72) Inventors: Fu-Ting Yen, Hsinchu (TW); Yu-Yun Peng, Hsinchu (TW); Kuei-Lin Chan, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 381 days.

(21) Appl. No.: 18/139,070

(22) Filed: Apr. 25, 2023

(65) Prior Publication Data

US 2024/0363744 A1 Oct. 31, 2024

(51) Int. Cl.
| | |
|---|---|
| *H01L 29/775* | (2006.01) |
| *H01L 29/06* | (2006.01) |
| *H01L 29/423* | (2006.01) |
| *H01L 29/66* | (2006.01) |
| *H10D 30/01* | (2025.01) |
| *H10D 30/43* | (2025.01) |
| *H10D 30/67* | (2025.01) |
| *H10D 62/10* | (2025.01) |
| *H10D 64/01* | (2025.01) |

(52) U.S. Cl.
CPC ........... *H10D 30/43* (2025.01); *H10D 30/014* (2025.01); *H10D 30/6735* (2025.01); *H10D 62/121* (2025.01); *H10D 64/017* (2025.01)

(58) Field of Classification Search
CPC .. H10D 30/43; H10D 30/014; H10D 30/6735; H10D 62/121; H10D 64/017
USPC ........................................................ 257/347
See application file for complete search history.

(56) References Cited

U.S. PATENT DOCUMENTS

2023/0038116 A1* 2/2023 Xie ...................... H01L 21/0259
2023/0061555 A1* 3/2023 Chen .................... H10D 62/121

* cited by examiner

*Primary Examiner* — Tong-Ho Kim
(74) *Attorney, Agent, or Firm* — Birch, Stewart, Kolasch & Birch, LLP

(57) ABSTRACT

A semiconductor device includes a substrate, a first active structure, a second active structure, a wall and a STI layer. The first active structure is formed on the substrate. The second active structure is formed on the substrate. The wall is formed between the first active structure and the second active structure. The STI layer is formed adjacent to the first active structure and has an upper surface. A distance between a spacer of the first active structure and the upper surface of the STI layer may range between 0 and 50 nanometers.

20 Claims, 13 Drawing Sheets

192                         191
1921  1923  1922      1913  1912  1911

2E_a'

2E_b

2E_b'

2E_a

180s2                                          180s1

120s1                                          110s1

145b   145b2      145a

145a2

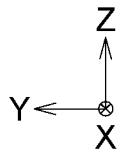
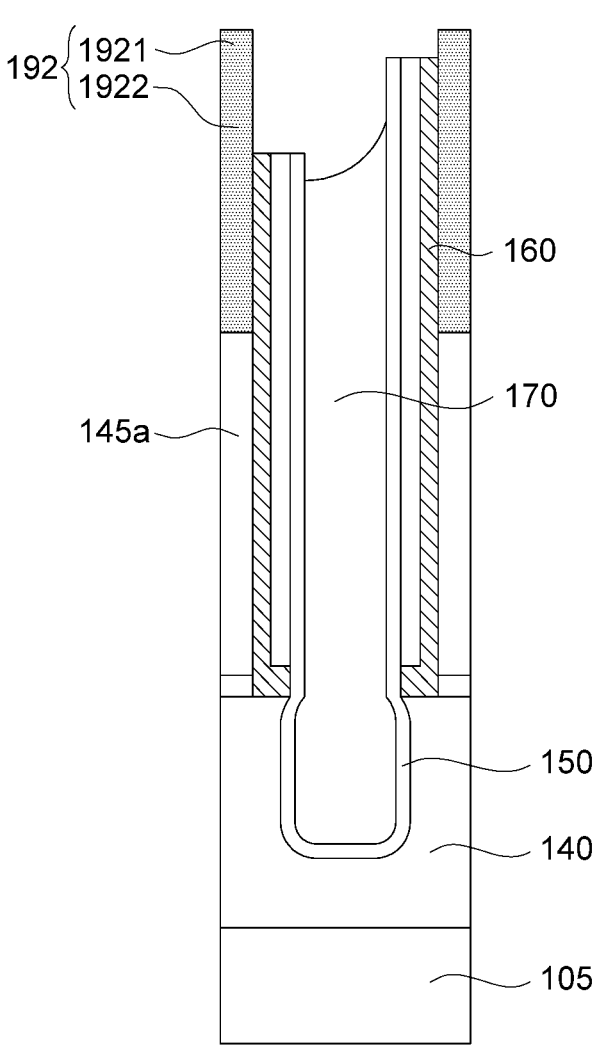
FIG. 2E_a

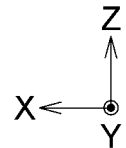
FIG. 2E_b

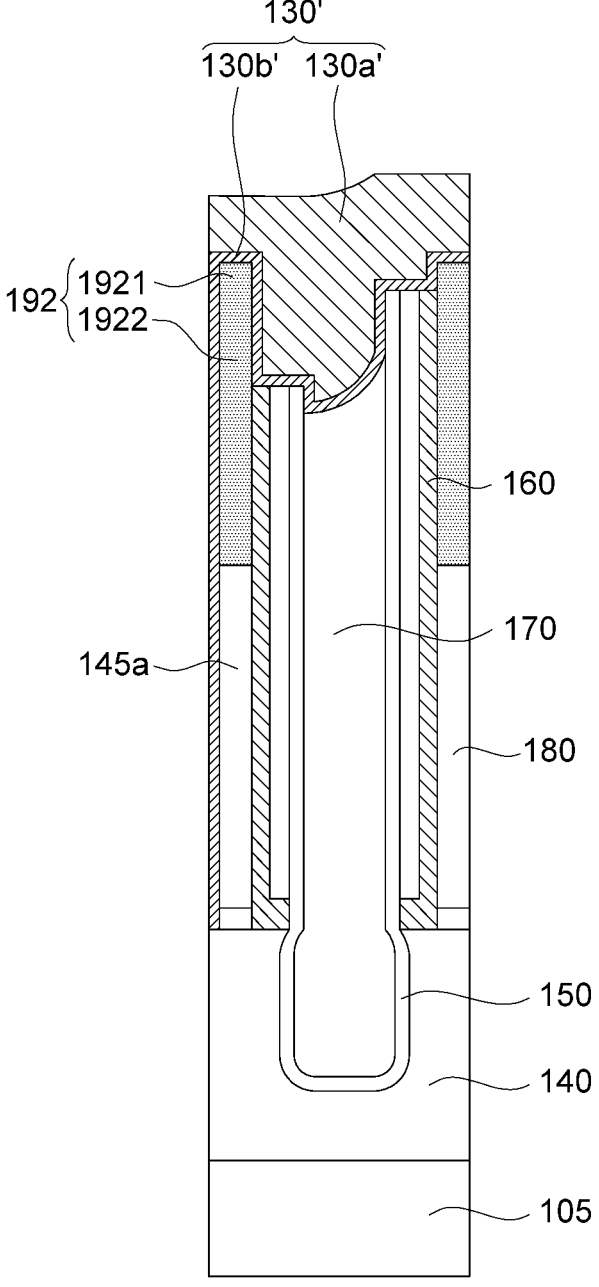
FIG. 2F_a

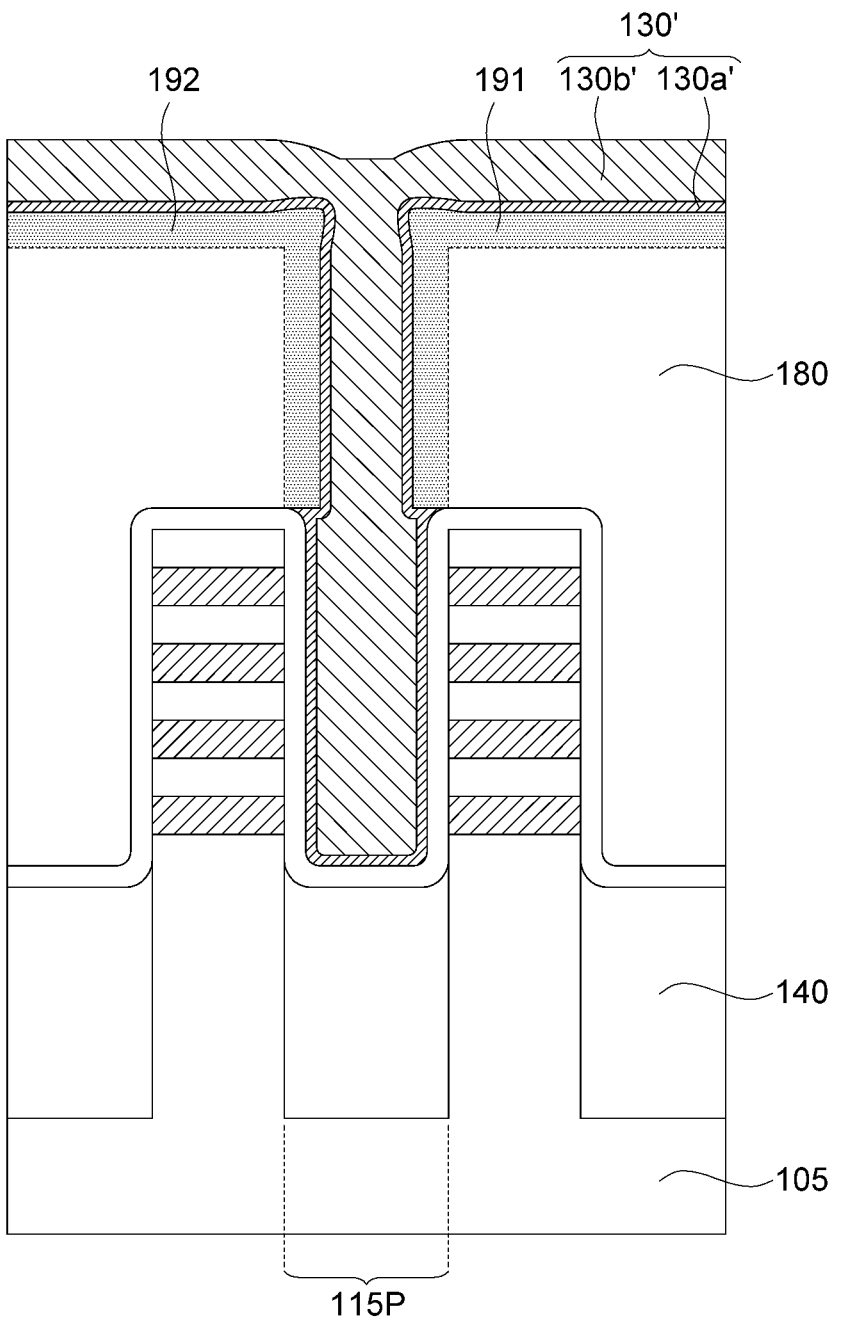
FIG. 2F_b

SEMICONDUCTOR DEVICE AND MANUFACTURING METHOD THEREOF

BACKGROUND

In forksheet structure, a wall formed between OD (Oxide definition) and OD is required to be trimmed for exposing a top of a silicon sheet of the OD. During the wall trimming, heavier etching is applied for the wall trimming. However, it causes extra STI material loss and worse epitaxy damage.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
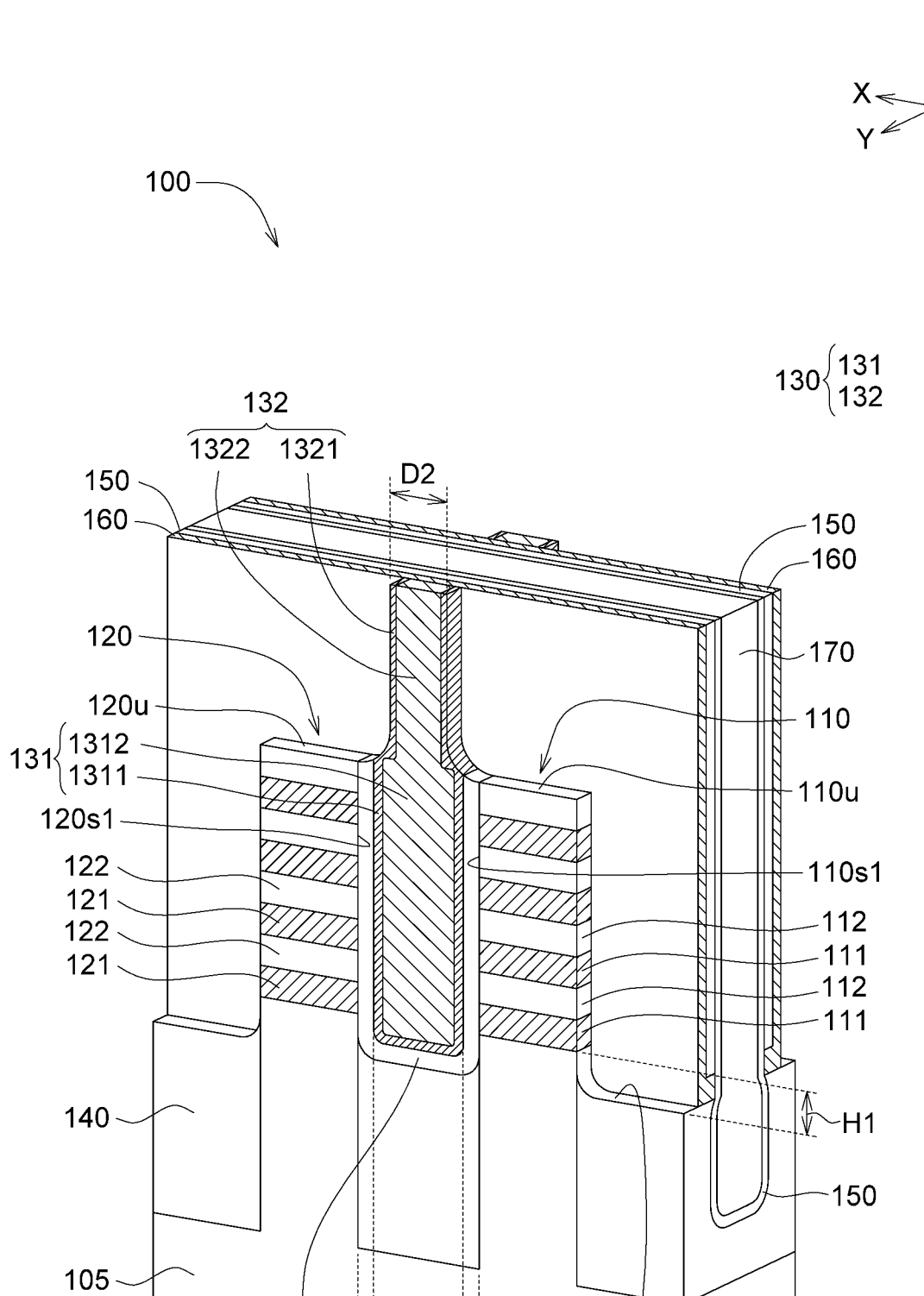
FIG. 1 illustrates a schematic diagram of a semiconductor device according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Referring to FIG. 1, FIG. 1 illustrates a schematic diagram of a semiconductor device 100 according to an embodiment of the present disclosure. The semiconductor device 100 is, for example, a forksheet semiconductor device. The semiconductor device 100 includes a substrate 105, at least one first active structure 110, at least one second active structure 120, a wall 130, a STI (Shallow Trench Isolation) layer 140, an oxide layer 145, a bottom contact etching stop layer (BCESL) 150, at least one dummy gate spacer 160, an interlayer dielectric (ILD) 170.

As illustrated in FIG. 1, the substrate 105 is, for example, silicon wafer. The first active structure 110, the second active structure 120, the wall 130, the STI layer 140, the oxide layer 145, the BCESL 150, the dummy gate spacer 160 and the ILD 170 is formed on the substrate 105.

As illustrated in FIG. 1, the first active structure 110 includes a plurality of sheet spacers 111 and a plurality of sheets 112, wherein one of the sheet spacers 111 is formed between two adjacent of the sheets 112, and the first active structure 110 has a first lateral surface 110$s$1. The first active structures 110 define one active region (or one OD (Oxide definition) region) in Y axis, for example. Similarly, the second active structure 120 has a second lateral surface 120$s$1 facing the first lateral surface 110$s$1. The second active structure 120 includes the structure similar to or the same as that of the first active structure 110. For example, the second active structure 120 includes a plurality of sheet spacers 121 and a plurality of sheets 122, wherein one of the sheet spacers 121 is formed between two adjacent of the sheets 122. The second active structures 120 define one active region (or one OD region) in Y axis, for example.

The sheet spacers 111 of the first active structure 110 may be formed of a material including, for example, silicon germanium, and the sheets 112 may be formed of a material including, for example, silicon. Similarly, the sheet spacers 121 of the second active structures 110 may be formed of a material including, for example, silicon germanium, and the sheets 122 may be formed of a material including, for example, silicon.

As illustrated in FIG. 1, a distance H1 between the bottommost sheet spacer 111 of the first active structure 110 and an upper surface 140$u$ of the STI layer 140 may range, for example, between 0 and 50 nanometers (nm), such as 0.1 nm, 0.2 nm, 0.3 nm, 0.4 nm, 0.5 nm, . . . , 49.5 nm, 49.6 nm, 49.7 nm, 49.8 nm, 49.9 nm, etc.

As illustrated in FIG. 1, the wall 130 is formed between the first active structure 110 and the second active structure 120. The wall 130 includes a first wall portion 131 and a second wall portion 132. The first wall portion 131 is formed within an interval 115P between the first active structure 110 and the second active structure 120, and the second wall portion 132 is protruded with respect to a first top surface 110$u$ of the first active structure 110 and a second top surface 120$u$ of the second active structure 120. In addition, the first wall portion 131 has a first width D1, the second wall portion 132 has a second width D2, wherein the second width D2 is less than the first width D1. As a result, the STI layer 140 may not be covered by the second wall portion 132 for being etched in subsequent processes, for example, a process of etching the sheet spacer 111 and the sheet spacer 121.

As illustrated in FIG. 1, the first wall portion 131 fills a space between the first active structure 110 and the second active structure 120. The first wall portion 131 includes a first shell layer 1311 and a first core layer 1312, wherein the first shell layer 1311 is formed on the first lateral surface 110$s$1 of the first active structure 110 and the second lateral surface 120$s$1 of the second active structure 120, and the first core layer 1312 is formed the first wall layer 1311. In an embodiment, the first shell layer 1311 may be formed of a material including, for example, SiOC and/or SiOCN, while the first core layer 1312 may be formed of a material including, for example, SiN and/or SiCN. In another embodiment, the first shell layer 1311 may be formed of a material including, for example, SiN and/or SiCN, while the first core layer 1312 may be formed of a material including, for example, SiOC and/or SiOCN.

As illustrated in FIG. 1, the second wall portion 132 includes a second shell layer 1321 and a second core layer 1322, wherein the second shell layer 1321 is formed on the second core layer 1322. In an embodiment, at least one portion of the second shell layer 1321 may be removed in subsequent processes, for example, etching, etc. In addition, the second shell layer 1321 may be formed of a material similar to or the same as that of the first shell layer 1311, and/or the second core 1322 may be formed of a material similar to or the same as that of the first core 1312. In an embodiment, the second shell layer 1321 may be formed of a material including Si, nitride, oxide or a combination thereof, for example, SiN, SiOx, etc.

As illustrated in FIG. 1, the STI layer 140 is formed on the substrate 105, and within the interval 115P between the first active structure 110 and the second active structure 120.

Although not illustrated, the semiconductor device 100 further includes a plurality of source epitaxies and a plurality of drain epitaxies. As illustrated in FIG. 1, the BCESL 150 may cover the source epitaxies and the drain epitaxies. The BCESL 150 may be formed by using, for example, deposition, such as chemical vapor deposition (CVD), Plasma-Enhanced Chemical Vapor Deposition (PECVD), ALD (atomic layer deposition), or the like. The BCESL 150 may be formed of a material including, for example, a dielectric material, such as silicon nitride, silicon oxide, silicon oxynitride, or the like. The spacer 160 is covered by the wall 130 and extends in X axis. In an embodiment, the spacer 160 is, for example, a dummy gate spacer which may cover at least one dummy gate 180 (which has already removed in FIG. 1). The ILD 170 covers the BCESL 150. In an embodiment, the ILD 170 may be formed by using, for example, deposition, such as CVD, PECVD, or flowable chemical vapor deposition (FCVD), or the like. The ILD 170 may be formed of a dielectric including, for example, phospho-silicate glass (PSG), boro-silicate glass (BSG), boron-doped phospho-silicate glass (BPSG), undoped silicate glass (USG), or the like. Other insulation materials formed by any acceptable process may be used.

FIGS. 2A to 2H illustrate schematic diagrams of manufacturing processes of the semiconductor device 100 of FIG. 1.

Figure 2A:
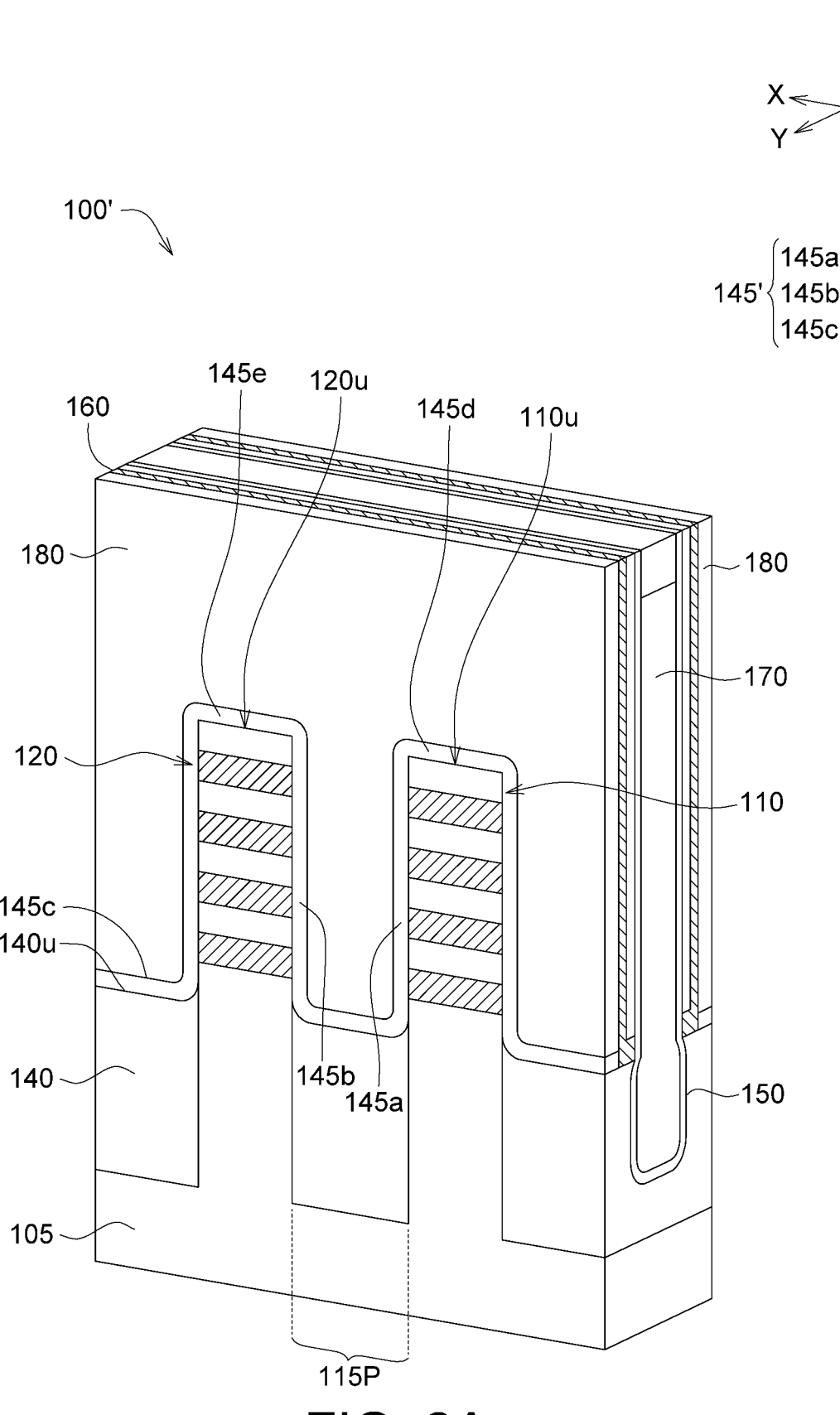
FIGS. 2A to 2H illustrate schematic diagrams of manufacturing processes of the semiconductor device of FIG. 1.

As illustrated in FIG. 2A, a semiconductor device 100' is provided, wherein the semiconductor device 100' includes at least one first active structure 110, at least one second active structure 120, the STI layer 140, an oxide layer material 145', a plurality of the source epitaxies (not illustrated), a plurality of the drain epitaxies (not illustrated), at least one BCESL 150 (which may covers a plurality of the source epitaxies and/or a plurality of the drain epitaxies), at least one spacer 160, at least one ILD 170, at least one dummy gate 180.

As illustrated in FIG. 2A, in the semiconductor device 100', the first active structure 110 and the second active structure 120 may extend in Y axis, and pass through at least one dummy gates 180 in Y axis. In addition, one first active structure 110 and one second active structure 120 are referred to as an active structure set, and the number of the active structure set may be at least one or plural. The oxide layer material 145' covers the first active structure 110, the second active structure 120 and the STI layer 140. Furthermore, the oxide layer material 145' includes a first portion 145a, a second portion 145b and a third portion 145c, a first upper oxide portion 145d and a second upper oxide portion 145e, wherein the first portion 145a covers the first lateral surface 110s1, the second portion 145b covers the second lateral surface 120s1, the third portion 145c covers the upper surface 140u of the STI layer 140, the first upper oxide portion 145d covers the first top surface 110u of the first active structure 110, and the second upper oxide portion 145e covers the second top surface 120u of the second active structure 120. The BCESL 150 covers the source epitaxies and the drain epitaxies. The spacer 160 is, for example, the dummy gate spacer which covers the dummy gate 180. The ILD 170 covers the BCESL 150, the source epitaxies and the drain epitaxies.

As illustrated in FIG. 2A, the dummy gate 180 is formed over a portion of the first active structure 110 and a portion of the second active structure 120 in X axis. The dummy gate 180 may be a conductive or non-conductive material and may be selected from a group including amorphous silicon, polycrystalline-silicon (polysilicon), poly-crystal-line silicon-germanium (poly-SiGe), metallic nitrides, metallic silicides, metallic oxides, and metals. The dummy gate 180 may be deposited by physical vapor deposition (PVD), CVD, sputter deposition, or other techniques for depositing the selected material. The dummy gate 180 may be formed of other materials that have a high etching selectivity from the etching of isolation regions.

Figure 2B:
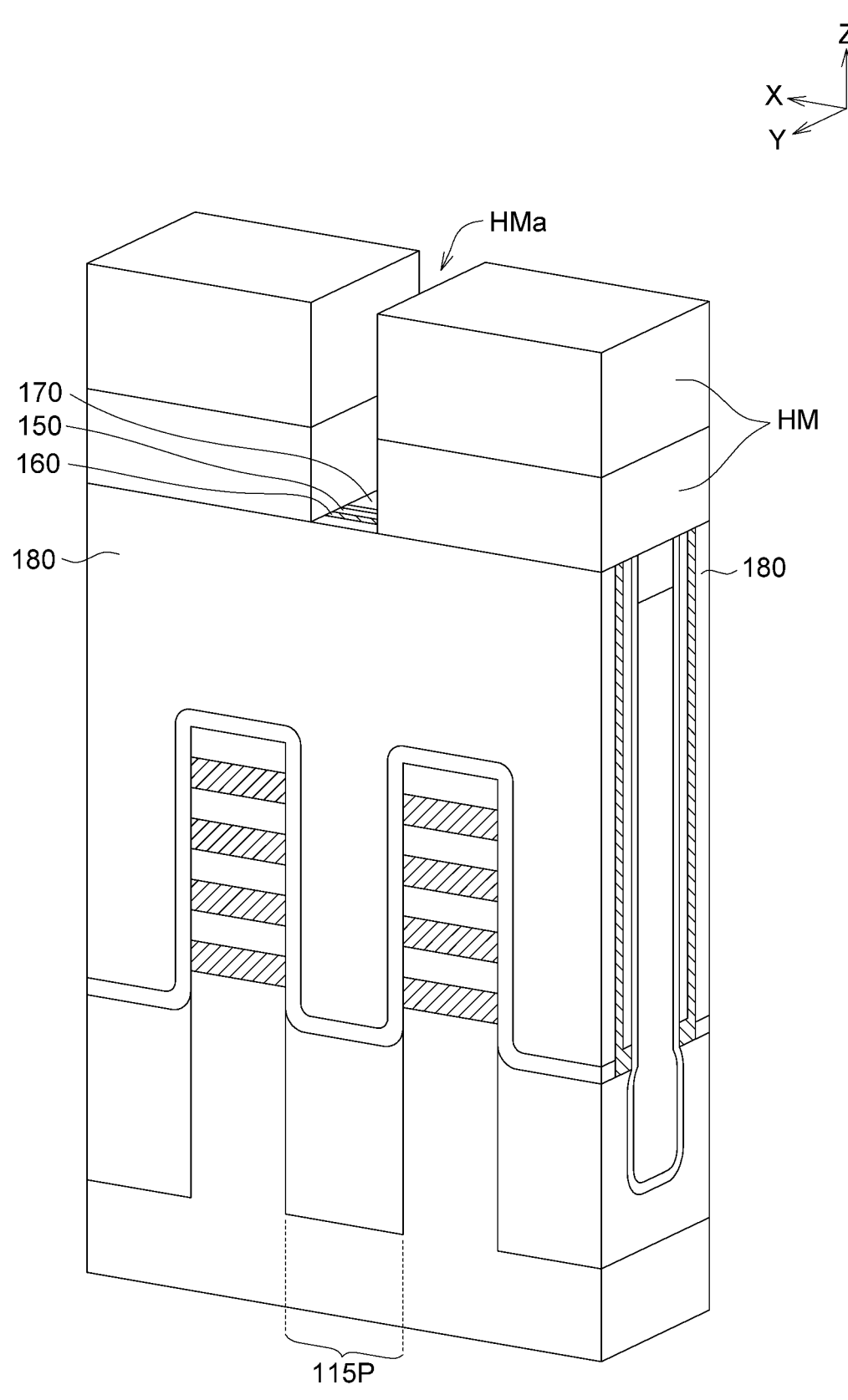

As illustrated in FIG. 2B, a patterned hard mask HM (the upper layer is, for example, photoresist layer, and the lower layer is, for example, nitride layer) having an opening HMa which exposes a portion of the BCESL 150, a portion of the ILD 170, a portion of the dummy gate 180 and a portion of the spacer 160 which are corresponding to the interval 115P is formed by using, for example, photolithography, etc.

Figure 2C:
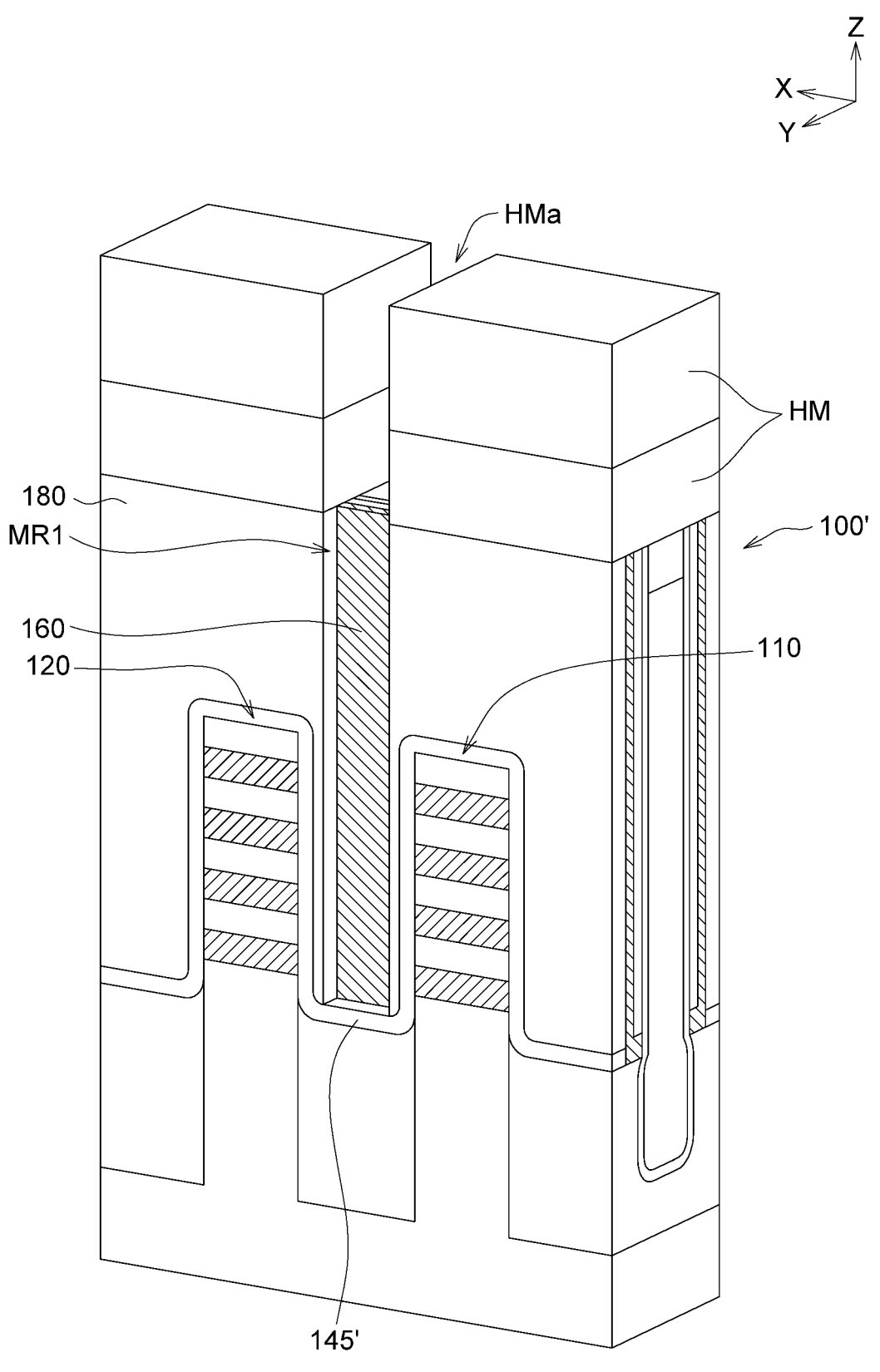

As illustrated in FIG. 2C, an initial recess MR1 is formed on the dummy gate 180 to expose a portion of the dummy gate spacer 160, through the patterned hard mask HM, by using, for example, etching, etc., wherein the initial recess MR1 extend from an top of the semiconductor device 100' to the oxide layer material 145' in axis X, and extends from a lateral surface of the dummy gate 180 to the spacer 160 to expose the spacer 160 in axis Y.

Figure 2D:
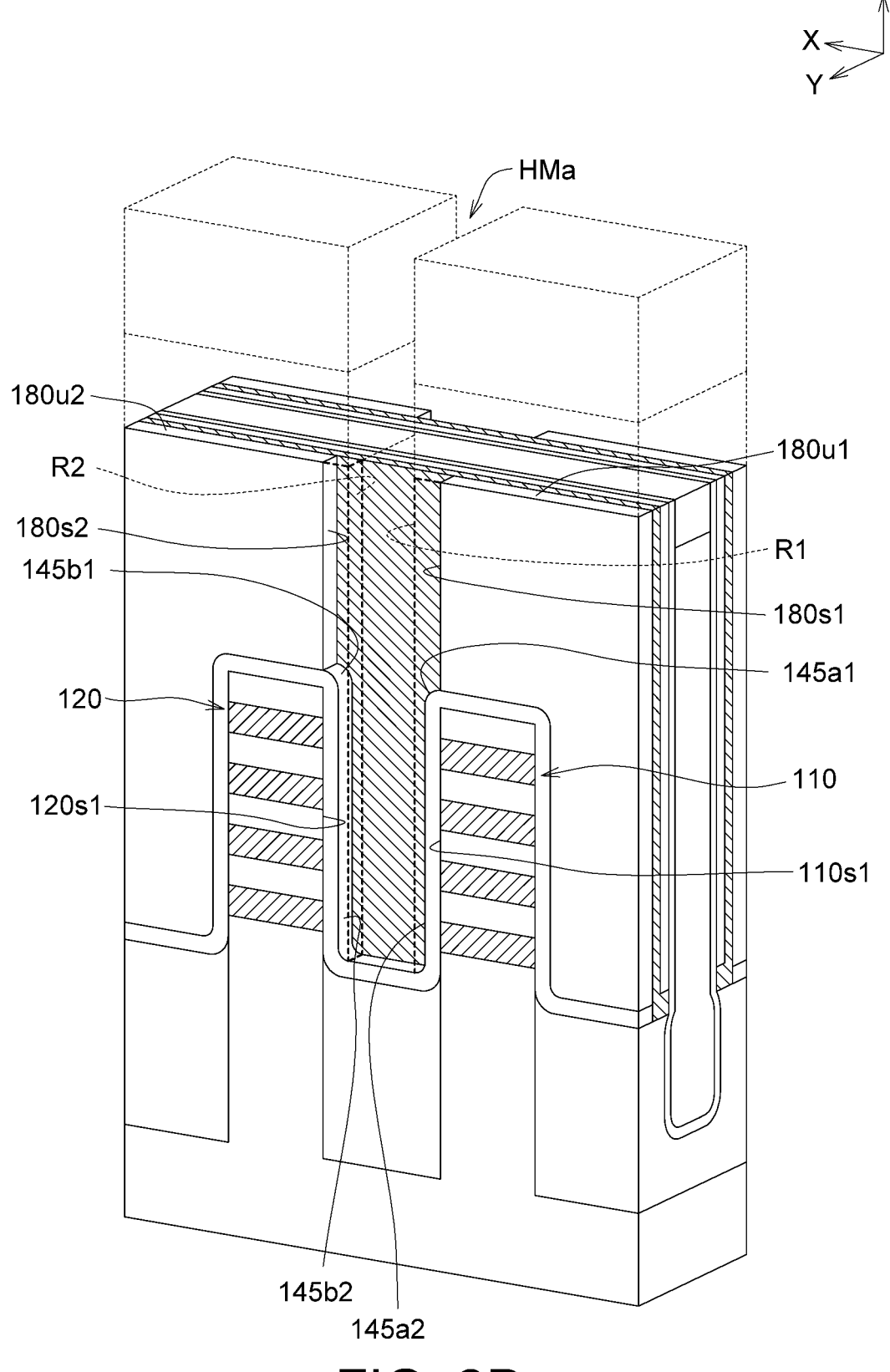

As illustrated in FIG. 2D, a first recess R1 is formed on the dummy gate 180 to expose the first portion 145a of the oxide layer material 145' by, for example, wet etching, etc., and a second recess R2 is formed on the dummy gate 180 to expose the second portion 145b of the oxide layer material 145' by, for example, wet etching, etc. The first recess R1 and the second recess R2 may be formed in the same process. During wet etching process, chemical solution or etchant may etch a portion of the dummy gate 180 to form the first recess R1 and the second recess R2 through the opening HMa of the patterned hard mask HM. After the first recess R1 and the second recess R2 are formed, the patterned hard mask HM may be removed to expose a first upper surface 180u1 and a second upper surface 180u2 of the dummy gate 180 by, for example, etching, CMP, etc.

In addition, the first recess R1 may be recessed with respect to a first sidewall 145a2 of the first portion 145a, and the second recess R2 may be recessed with respect to a second sidewall 145b2 of the second portion 145b. The first recess R1 exposes a first corner $145_{a1}$ of the first portion 145a, and the second recess R2 exposes a second corner 145b1 of the second portion 145b. In another embodiment, the first recess R1 is recessed with respect to the first lateral surface 110s1, and the second recess R2 is recessed with respect to the second lateral surface 120s1, for example. After the first recess R1 and the second recess R2 are formed, the dummy gate 180 has a first lateral surface 180s1 (the first lateral surface 180s1 also regarded as a first lateral surface of the first recess R1) and a second lateral surface 180s2 (the second lateral surface 180s2 also regarded as a second lateral surface of the second recess R2) opposite to the first lateral surface 180s1. In addition, the first recess R1, the second recess R2 and the initial recess MR1 may be collectively referred to as "a recess".

Figure 2E:
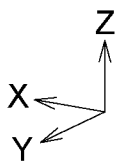

As illustrated in FIGS. 2E, 2E_a and 2E_b, FIG. 2E_a illustrates cross-sectional view of the structure along a direction 2E_a-2E_a' of FIG. 2E, and FIG. 2E_b illustrates cross-sectional view of the structure along a direction 2E_b-2E_b' of FIG. 2E.

In this step, a first growth portion 191 and a second growth portion 192 are formed on the dummy gate 180 by etching for a growth material and depositing for the growth material. The growth material is similar to or the same as that of the dummy gate 180. This step also may be referred to as "silicon re-depositing". In an embodiment, the first growth portion 191 and the second growth portion 192 each has a thickness t1 ranging between, for example, 5 nanometers to 6 nanometers, greater, or smaller.

In the present embodiment, the etching has an etching rate for the growth material, the first growth portion 191, the second growth portion 192 have a first deposition rate for the growth material, and the oxide layer material 145' has a second deposition rate for the growth material, wherein the etching rate is greater than the second deposition rate but less than the first deposition rate. As a result, there is no growth material formed on the first portion 145a and the second portion 145b of the oxide layer material 145' after the first growth portion 191 and the second growth portion 192 are formed.

In an embodiment, the first growth portion 191 and the second growth portion 192 are formed by epitaxial growth process (for example, a-Si growth process) with hydrochloric acid (HCl) at a temperature higher than 580° C. At high temperature, the hydrochloric acid may generate the effect of etching. In another embodiment, the first growth portion 191 and the second growth portion 192 are formed by an atomic layer deposition (ALD) with a plasma at a temperature lower than 300° C., wherein the plasma is, for example, $H_2$ plasma with Disilane/Silane/SiF$_4$, and the ALD is, for example, thermal ALD, PEALD (plasma enhanced ALD), etc. In an embodiment, silicon deposit precursor could be disilane, silane, SiF$_4$, SiCl$_2$H$_2$, Si$_2$Cl$_6$, Si$_2$H$_2$Cl$_4$, etc., and the selective etching process type could be $H_2$ plasma, HCl, NF$_3$, etc.

The first growth portion 191 may include a first upper part 1911 and a first lateral part 1912, wherein the first upper part 1911 is formed on the first upper surface 180u1 of the dummy gate 180, and the first lateral part 1912 is formed on the first lateral surface 180s1 of the dummy gate 180 and protrudes with respect to the first lateral surface 110s1 of the first active structure 110. In an embodiment, the first lateral part 1912 may be aligned with the first sidewall 145a2 of the first portion 145a, or protrudes beyond the first sidewall 145a2 of the first portion 145a. Similarly, the second growth portion 192 includes a second upper part 1921 and a second lateral part 1922, wherein the second upper part 1921 is formed on the second upper surface 180u2 of the dummy gate 180, and the second lateral part 1922 is formed on the second lateral surface 180s2 of the dummy gate 180 and protrudes with respect to the second lateral surface 120$_{s1}$ of the second active structure 120. In an embodiment, the second lateral part 1922 may be aligned with the second sidewall 145b2 of the second portion 145b, or protrudes beyond the second sidewall 145b2 of the second portion 145b.

In addition, due to the process of silicon re-depositing, the first growth portion 191 forms a first corner 1913 having an outer diameter greater than the thickness t1 of the first growth portion 191. The first corner 1913 protrudes with respect to an upper surface of the first upper part 1911 and a lateral surface of the first lateral part 1912. The first corner 1913 has a curved-surface. Similarly, due to the process of silicon re-depositing, the second growth portion 192 forms a second corner 1923 having an outer diameter greater than the thickness t1 of the second growth portion 192. The second corner 1923 protrudes with respect to an upper surface of the second upper part 1921 and a lateral surface of the second lateral part 1922. The second corner 1923 has a curved-surface.

Figure 2F:

As illustrated in FIGS. 2F, 2F_a and 2F_b, FIG. 2F_a illustrates cross-sectional view of the structure along a direction 2F_a-2F_a' of FIG. 2F, and FIG. 2F_b illustrates cross-sectional view of the structure along a direction 2F_b-2F_b' of FIG. 2E.

In this step, a wall material 130' is formed within the interval 115P and over the first growth portion 191 and the second growth portion 192. The wall material 130' includes a shell material 130a' and a core material 130b', wherein the shell material 130a' covers the first growth portion 191, the second growth portion 192, the first portion 145a and the second portion 145b in the interval 115P, and the core material 130b' covers the shell material 130a'. The shell material 130a' may be formed of a material similar to or the same as that of the first shell layer 1311 (or the second shell layer 1321), and the core material 130b' may be formed of a material similar to or the same as that of the first core layer 1312 (or the second core layer 1322).

Figure 2G:
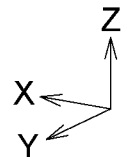
Figure 2G:
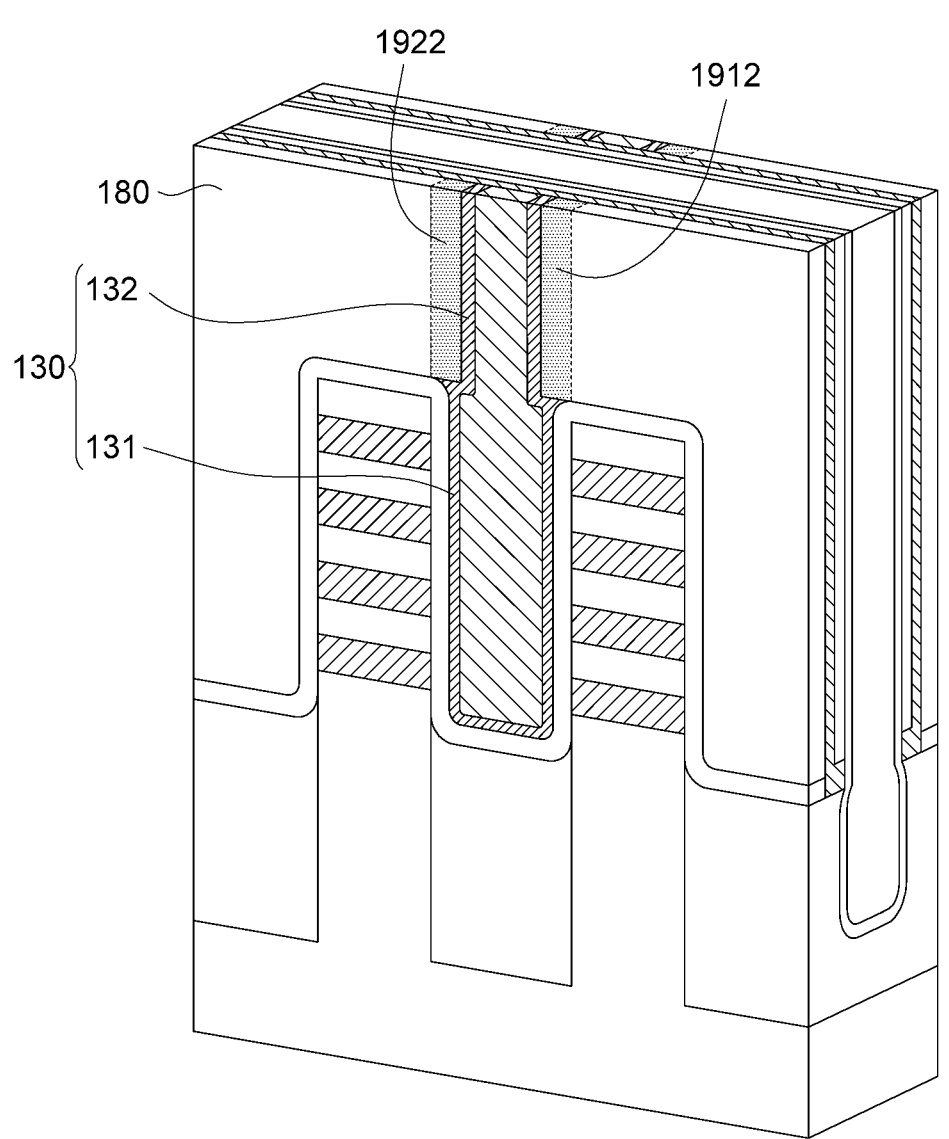

As illustrated in FIG. 2G, a portion (for example, the first upper part 1911) of the first growth portion 191, a portion (for example, the second upper part 1921) of the second growth portion 192, a portion of the shell material 130a' and a portion of the core material 130b' of FIG. 2G_b are removed to form the wall 130 including the first wall portion 131 and the second wall portion 132 by using, for example, CMP, etc.

Figure 2H:
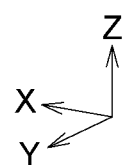
Figure 2H:
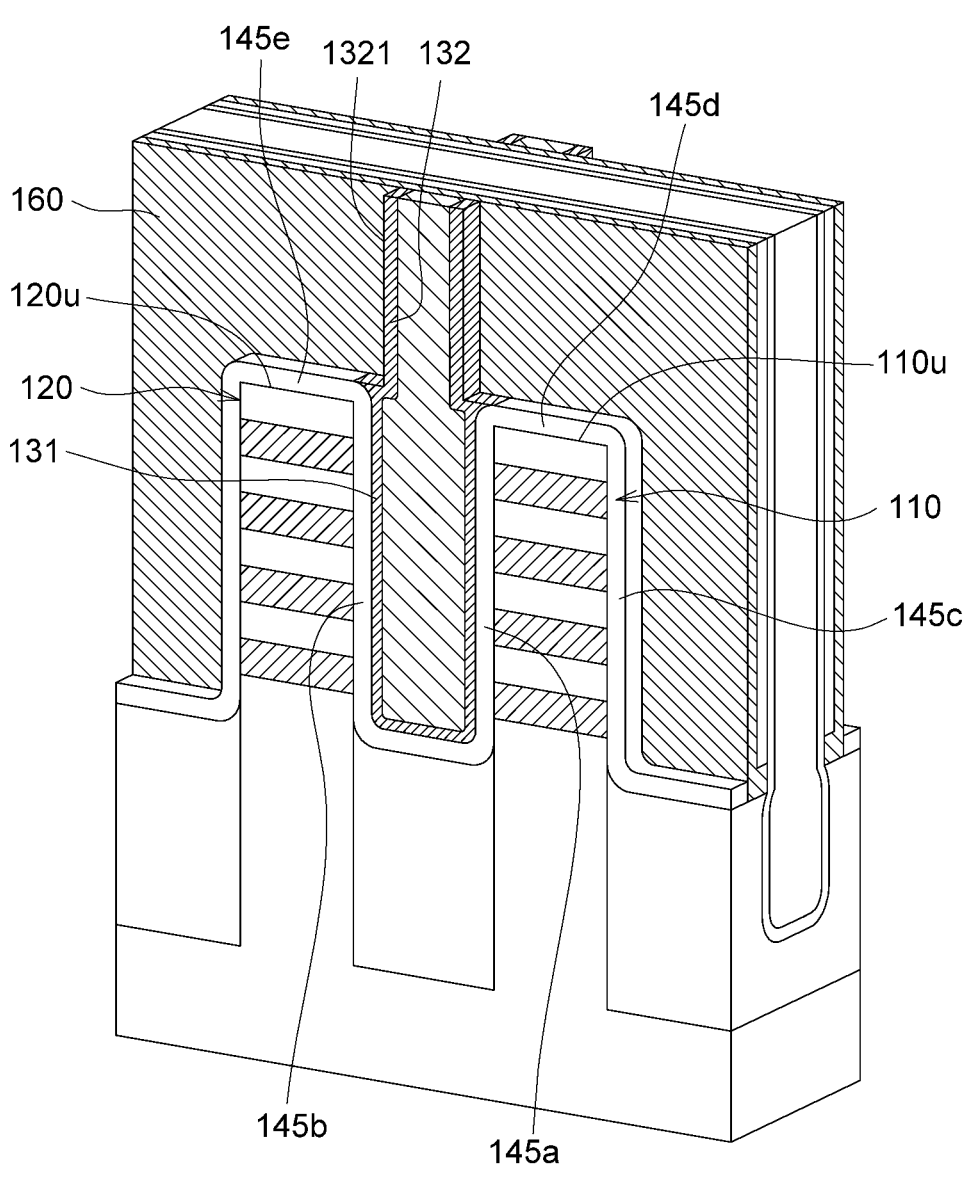

As illustrated in FIG. 2H, the dummy gate 180, a portion (for example, the first lateral part 1912) of the first growth portion 191 and a portion (for example, the second lateral part 1922) of the second growth portion 192 the of FIG. 2G are removed to expose the spacer 160, a lateral surface of the second wall portion 132, the first upper oxide portion 145d corresponding to the entire of the first top surface 110u of the first active structure 110 and the second upper oxide portion 145e corresponding to the entire of the second top surface 120u of the second active structure 120 by using, for example, etching, etc.

Then, as illustrated in FIG. 1, the third portion 145c, the first upper oxide portion 145d and the second upper oxide portion 145e of FIG. 2H are removed to form the oxide layer 145 by using, for example, etching, etc., wherein the entire of the first top surface 110u of the first active structure 110, the entire of the second top surface 120u of the second active structure 120, the sheet spacers 111 of the first active structure 110 and the sheet spacers 121 of the second active structure 120 are exposed after being etched. In addition, at least one portion of the second shell layer 1321 of the second wall portion 132 in FIG. 1 may be removed during the removing for the third portion 145c, or in subsequent process for other material.

In the present embodiment, after the dummy gate 180 is removed, the wall 130 which has already exposed the first corner 145a1 of the first portion 145a and the second corner 145b1 of the second portion 145b is not required to be etched. Thus, compared to the etching (for example, heavy etching and/or multi etching processes) for both of the third portion 145c and the wall which is not exposed the first corner 145a1 of the first portion 145a and the second corner 145b1 of the second portion 145b, the etching for only the third portion 145c may be low concentration or mild in the present embodiment. As a result, such light or mild etching may avoid the spacer 160 to be over-damaged (for example, avoiding to form an etching crack, etching slot, etching gap, a bamboo region, etc.) to expose the BCESL 150, the source epitaxy and/or the drain epitaxy, and accordingly it may avoid the BCESL 150, the source epitaxy and/or the drain epitaxy to be damaged through the damaged spacer 160. In addition, due to the removing for the third portion 145c only needing one etching process in the present embodiment, it may avoid extra STI loss.

Then, the exposed sheet spacers 111 of the first active structure 110 and the exposed sheet spacers 121 of the second active structure 110 may be removed by using, for example, dry etching, etc. Due the entire of the first top surface 110u and the entire of the second top surface 120u being exposed, the topmost first sheet 112 and the topmost second sheet 122 may have uniform thickness in Z axis after being etched.

Then, at least one interface layer (IL) (not illustrated) over the sheets 112 and the sheets 122 is formed, then at least one High-k (HK) gate dielectric layer (not illustrated) over the interface layer is formed, and then at least one metal gate MG (not illustrated) is formed around the sheets. The process may include chemical etching, such as HF, NH₃ gas or a combination thereof.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

According to the present disclosure, a semiconductor method at least includes processes of forming the recess on the dummy gate, forming the first growth portion and the second growth portion within the recess, and the wall is formed within the recess. As a result, after the dummy gate is removed, the wall which has already exposed the first corner and the second corner of the oxide layer material is not required to be etched, and accordingly the etching for oxide layer material may be lighter or milder.

Example embodiment 1: a semiconductor device includes a substrate, a first active structure, a second active structure, a wall and a STI layer. The first active structure is formed on the substrate. The second active structure is formed on the substrate. The wall is formed between the first active structure and the second active structure. The STI layer is formed adjacent to the first active structure and has an upper surface. A distance between a spacer of the first active structure and the upper surface of the STI layer ranges between 0 and 50 nm.

Example embodiment 2 based on Example embodiment 1: the wall comprises the wall includes a first wall portion and a second wall portion, the first wall portion is formed within an interval between the first active structure and the second active structure, the second wall portion is protruded with respect to a first top surface of the first active structure and a second top surface of the second active structure.

Example embodiment 3 based on Example embodiment 1: the second wall portion includes a second shell layer and a second core layer, and the second shell layer is formed on the second core layer.

Example embodiment 4 based on Example embodiment 1: a manufacturing method for a semiconductor device includes: forming a first active structure, a second active structure and a dummy gate on a substrate, wherein the dummy gate covers a portion of the first active structure and a portion of the second active structure; forming a recess on the dummy gate, wherein the dummy gate has a first lateral surface and a second lateral surface opposite to the first lateral surface; forming a first growth portion and a second growth portion within the recess, wherein the first growth portion is formed on the first lateral surface of the dummy gate, and the second growth portion is formed o on the second lateral surface of the dummy gate; forming a wall in the recess; and removing the first growth portion, the second growth portion and the dummy gate.

Example embodiment 5 based on Example embodiment 4: the manufacturing method further includes: forming a STI layer on the substrate; in removing the first growth portion and the second growth portion, a distance between a bottommost spacer of the first active structure and an upper surface of the STI layer ranges between 0 and 50 nm.

Example embodiment 6 based on Example embodiment 4: the manufacturing method further includes: forming a dummy gate spacer covering the dummy gate; and in forming the recess on the dummy gate, the dummy gate spacer is exposed from the recess.

Example embodiment 7 based on Example embodiment 4: the manufacturing method further includes: forming a dummy gate spacer covering the dummy gate; wherein forming the recess on the dummy gate includes: forming an initial recess to expose a portion of the dummy gate spacer; and forming a first recess and a second recess on the dummy gate to expose an oxide layer material which covers the first active structure and the second active structure.

Example embodiment 8 based on Example embodiment 7: in forming the first recess and the second recess on the dummy gate, the first recess is recessed with respect to a first sidewall of the oxide layer material, and the second recess is recessed with respect to a second sidewall of the oxide layer material.

Example embodiment 9 based on Example embodiment 7: in forming the first recess and the second recess on the dummy gate, the first recess expose a first corner of the oxide layer material, and the second recess expose a second corner of the oxide layer material.

Example embodiment 10 based on Example embodiment 4: in forming the first growth portion and the second growth portion, the first growth portion includes a first lateral part, the second growth portion includes a second lateral part, the first lateral part protrudes with respect to the first lateral surface of the dummy gate, the second lateral part protrudes with respect to the first second surface of the dummy gate.

Example embodiment 11 based on Example embodiment 4: in forming the first growth portion on the first lateral surface of the dummy gate and the second growth portion on the second lateral surface of the dummy gate, the first growth portion and the second growth portion are formed by etching for a growth material and depositing for the growth material.

Example embodiment 12 based on Example embodiment 11: the etching has an etching rate for the growth material, the first growth portion and the second growth portion have a first deposition rate for the growth material, an oxide layer material has a second deposition rate for the growth material, and the etching rate is greater than the second deposition rate but less than the first deposition rate.

Example embodiment 13 based on Example embodiment 11: in forming the first growth portion on the first lateral surface of the dummy gate and the second growth portion on the second lateral surface of the dummy gate, the first growth portion and the second growth portion are formed by epitaxial growth process with hydrochloric acid at a temperature higher than 580° C.

Example embodiment 14 based on Example embodiment 11: in forming the first growth portion on the first lateral surface of the dummy gate and the second growth portion on the second lateral surface of the dummy gate, the first growth portion and the second growth portion are formed by an atomic layer deposition (ALD) with a plasma ($H_2$) at a temperature lower than 300° C.

Example embodiment 15 based on Example embodiment 4: the manufacturing method further includes: forming an oxide layer material over the first active structure and the second active structure; wherein removing the first growth portion, the second growth portion and the dummy gate further comprises: removing a portion of the oxide layer material which is not covered by the wall.

Example embodiment 16 based on Example embodiment 4: in forming a first growth portion and a second growth portion within the recess, the first growth portion and the second growth portion each having a thickness ranging between 5 nanometers to 6 nanometers.

Example embodiment 17 based on Example embodiment 4: in forming a wall in the recess, the wall comprises a first wall portion and a second wall portion, the first wall portion is formed within an interval between the first active structure and the second active structure, the second wall portion is protruded with respect to a first top surface of the first active structure and a second top surface of the second active structure.

Example embodiment 18 based on Example embodiment 17: the manufacturing method further includes: removing at least one portion of the second wall portion.

Example embodiment 19: a manufacturing method for a semiconductor device includes: forming a first active structure, a second active structure and an oxide layer material on a substrate, wherein the oxide layer material covers the first active structure and the second active structure; forming a recess to expose a first corner and a second corner of the oxide layer material, wherein the recess has a first lateral surface and a second lateral surface opposite to the first lateral surface; forming a first growth portion and a second growth portion within the recess, wherein the first growth portion and the second growth portion are formed of a material the same as that of a dummy gate, the first growth portion is formed on the first lateral surface of the recess, and the second growth portion is formed o on the second lateral surface of the recess; forming a wall in the recess; removing the first growth portion and the second growth portion; and removing a portion of the oxide layer material which is not covered by the wall by etching.

Example embodiment 20 based on Example embodiment 19: in forming a first growth portion and a second growth portion within the recess, the first growth portion and the second growth portion are formed by etching for a growth material and depositing for the growth material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A manufacturing method for a semiconductor device, comprising:

forming a first active structure, a second active structure and a dummy gate on a substrate, wherein the dummy gate covers a portion of the first active structure and a portion of the second active structure;

forming a recess on the dummy gate, wherein the dummy gate has a first lateral surface and a second lateral surface opposite to the first lateral surface;

forming a first growth portion and a second growth portion within the recess, wherein the first growth portion is formed on the first lateral surface of the dummy gate, and the second growth portion is formed on the second lateral surface of the dummy gate;

forming a wall in the recess; and removing the first growth portion, the second growth portion and the dummy gate.

2. The manufacturing method as claimed in claim 1, further comprising:

forming a dummy gate spacer covering the dummy gate; and in forming the recess on the dummy gate, the dummy gate spacer is exposed from the recess.

3. The manufacturing method as claimed in claim 1, further comprising:

forming a dummy gate spacer covering the dummy gate;

wherein forming the recess on the dummy gate comprises:

forming an initial recess to expose a portion of the dummy gate spacer; and forming a first recess and a second recess on the dummy gate to expose an oxide layer material which covers the first active structure and the second active structure.

4. The manufacturing method as claimed in claim 3, wherein in forming the first recess and the second recess on the dummy gate, the first recess is recessed with respect to a first sidewall of the oxide layer material, and the second recess is recessed with respect to a second sidewall of the oxide layer material.

5. The manufacturing method as claimed in claim 3, wherein in forming the first recess and the second recess on the dummy gate, the first recess expose a first corner of the oxide layer material, and the second recess expose a second corner of the oxide layer material.

6. The manufacturing method as claimed in claim 1, wherein in forming the first growth portion and the second growth portion, the first growth portion comprises a first lateral part, the second growth portion comprises a second lateral part, the first lateral part protrudes with respect to the first lateral surface of the dummy gate, the second lateral part protrudes with respect to the first second surface of the dummy gate.

7. The manufacturing method as claimed in claim 1, in forming the first growth portion on the first lateral surface of the dummy gate and the second growth portion on the second lateral surface of the dummy gate, the first growth portion and the second growth portion are formed by etching for a growth material and depositing for the growth material.

8. The manufacturing method as claimed in claim 7, wherein the etching has an etching rate for the growth material, the first growth portion and the second growth portion have a first deposition rate for the growth material, an oxide layer material has a second deposition rate for the growth material, and the etching rate is greater than the second deposition rate but less than the first deposition rate.

9. The manufacturing method as claimed in claim 7, wherein in forming the first growth portion on the first lateral surface of the dummy gate and the second growth portion on the second lateral surface of the dummy gate, the first growth portion and the second growth portion are formed by epitaxial growth process with hydrochloric acid at a temperature higher than 580° C.

10. The manufacturing method as claimed in claim 7, wherein in forming the first growth portion on the first lateral surface of the dummy gate and the second growth portion on the second lateral surface of the dummy gate, the first growth portion and the second growth portion are formed by an atomic layer deposition (ALD) with a plasma (H2) at a temperature lower than 300° C.

11. The manufacturing method as claimed in claim 1, further comprises:

forming an oxide layer material over the first active structure and the second active structure;

wherein removing the first growth portion, the second growth portion and the dummy gate further comprises:

removing a portion of the oxide layer material which is not covered by the wall.

12. The manufacturing method as claimed in claim 1, in forming a first growth portion and a second growth portion within the recess, the first growth portion and the second growth portion each having a thickness ranging between 5 nanometers to 6 nanometers.

13. The manufacturing method as claimed in claim 1, in forming a wall in the recess, the wall comprises a first wall portion and a second wall portion, the first wall portion is formed within an interval between the first active structure and the second active structure, the second wall portion is protruded with respect to a first top surface of the first active structure and a second top surface of the second active structure.

14. The manufacturing method as claimed in claim 13, further comprising:

removing at least one portion of the second wall portion.

15. A manufacturing method for a semiconductor device, comprising:

forming a first active structure, a second active structure and an oxide layer material on a substrate, wherein the oxide layer material covers the first active structure and the second active structure;

forming a recess to expose a first corner and a second corner of the oxide layer material, wherein the recess has a first lateral surface and a second lateral surface opposite to the first lateral surface;

forming a first growth portion and a second growth portion within the recess, wherein the first growth portion and the second growth portion are formed of a material the same as that of a dummy gate, the first growth portion is formed on the first lateral surface of the recess, and the second growth portion is formed on the second lateral surface of the recess;

forming a wall in the recess;

removing the first growth portion and the second growth portion; and removing a portion of the oxide layer material which is not covered by the wall by etching.

16. The manufacturing method as claimed in claim 15, in forming a first growth portion and a second growth portion within the recess, the first growth portion and the second growth portion are formed by etching for a growth material and depositing for the growth material.

17. A manufacturing method for a semiconductor device, comprising:

forming a first active structure, a second active structure and a dummy gate on a substrate, wherein the dummy gate covers a portion of the first active structure and a portion of the second active structure;

forming a recess on the dummy gate, wherein the dummy gate has a first lateral surface and a second lateral surface opposite to the first lateral surface;

forming a first growth portion and a second growth portion within the recess, wherein the first growth portion is formed on the first lateral surface of the dummy gate, and the second growth portion is formed on the second lateral surface of the dummy gate;

forming a wall in the recess; and removing the first growth portion, the second growth portion and the dummy gate;

wherein the manufacturing method further comprises:

forming a STI (Shallow Trench Isolation) layer on the substrate;

in removing the first growth portion and the second growth portion, a distance between a bottommost spacer of the first active structure and an upper surface of the STI layer ranges between 0 and 50 nanometers.

18. The manufacturing method as claimed in claim 17, further comprising:

forming a dummy gate spacer covering the dummy gate; and in forming the recess on the dummy gate, the dummy gate spacer is exposed from the recess.

19. The manufacturing method as claimed in claim 17, further comprising:

forming a dummy gate spacer covering the dummy gate;

wherein forming the recess on the dummy gate comprises:

forming an initial recess to expose a portion of the dummy gate spacer; and forming a first recess and a second recess on the dummy gate to expose an oxide layer material which covers the first active structure and the second active structure.

20. The manufacturing method as claimed in claim 19, further comprising:

wherein in forming the first recess and the second recess on the dummy gate, the first recess is recessed with respect to a first sidewall of the oxide layer material, and the second recess is recessed with respect to a second sidewall of the oxide layer material.

\* \* \* \* \*